US008791717B2

(12) United States Patent
Chang et al.

(10) Patent No.: US 8,791,717 B2
(45) Date of Patent: Jul. 29, 2014

(54) ASYNCHRONOUS-LOGIC CIRCUIT FOR FULL DYNAMIC VOLTAGE CONTROL

(75) Inventors: Joseph Sylvester Chang, Singapore (SG); Bah Hwee Gwee, Singapore (SG); Kwen Siong Chong, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 13/810,184

(22) PCT Filed: Jul. 14, 2011

(86) PCT No.: PCT/SG2011/000253
§ 371 (c)(1),
(2), (4) Date: Jan. 14, 2013

(87) PCT Pub. No.: WO2012/008928
PCT Pub. Date: Jan. 19, 2012

(65) Prior Publication Data
US 2013/0113522 A1    May 9, 2013

Related U.S. Application Data

(60) Provisional application No. 61/364,478, filed on Jul. 15, 2010.

(51) Int. Cl.
*H03K 17/16* (2006.01)
(52) U.S. Cl.
USPC ............................ 326/26; 326/27; 326/104
(58) Field of Classification Search
USPC ................... 326/93, 26, 27, 95–98
See application file for complete search history.

(56) References Cited

U.S. PATENT DOCUMENTS

| | | | | | |
|---|---|---|---|---|---|
| 4,167,789 | A | * | 9/1979 | Faustini | 713/600 |
| 5,382,844 | A | * | 1/1995 | Knauer | 326/95 |
| 5,479,107 | A | * | 12/1995 | Knauer | 326/17 |
| 5,841,298 | A | * | 11/1998 | Huang | 326/97 |
| 6,097,222 | A | * | 8/2000 | Lovett | 326/121 |
| 6,133,761 | A | * | 10/2000 | Matsubara | 326/112 |
| 6,172,901 | B1 | | 1/2001 | Portacci | |
| 6,624,665 | B2 | * | 9/2003 | Kim et al. | 326/95 |
| 6,838,909 | B2 | * | 1/2005 | Huang et al. | 326/95 |

(Continued)

FOREIGN PATENT DOCUMENTS

DE    4214984 A1 * 11/1993    ........... H03K 19/094
WO    2012008928 A1    1/2012

OTHER PUBLICATIONS

Foreign Communication From a Related Counterpart Application—International Preliminary Report on Patentability, PCT/SG2011/000253, Jan. 24, 2013.

(Continued)

*Primary Examiner* — Vibol Tan

(57) ABSTRACT

Pre-Charge Static Logic (PCSL), is an asynchronous-logic Quasi-Delay-Insensitive architecture based on Static-Logic, featuring fully-range Dynamic Voltage Scaling including robust operation in the sub-threshold voltage regime, with simultaneous low hardware overheads, high-speed and yet low power dissipation. The invented PCSL logic circuit achieves this by integration of the Request sub-circuit into the Static-Logic cell. During the initial phase, the output of Static-Logic cell (within the PCSL logic circuit) is pre-charged. During the evaluate phase, the Static-Logic cell computes the input and the PCSL logic circuit outputs the computation.

19 Claims, 8 Drawing Sheets

AND/NAND
(a)

OR/NOR
(b)

AO/AOI
(c)

OA/OAI
(d)

XOR/XNOR
(e)

MUX
(f)

(56) References Cited

U.S. PATENT DOCUMENTS

| | | | |
|---|---|---|---|
| 6,949,954 B2* | 9/2005 | Nystrom et al. | 326/93 |
| 7,157,934 B2* | 1/2007 | Teifel et al. | 326/38 |
| 7,400,545 B2 | 7/2008 | Ramaraju et al. | |
| 7,417,468 B2* | 8/2008 | Verbauwhede et al. | 326/112 |
| 7,596,012 B1 | 9/2009 | Su et al. | |
| 7,659,751 B2* | 2/2010 | Morgenshtein | 326/121 |
| 7,692,449 B2* | 4/2010 | Verbauwhede et al. | 326/46 |
| 7,934,031 B2* | 4/2011 | Lines et al. | 710/100 |
| 7,977,972 B2* | 7/2011 | Di et al. | 326/46 |
| 8,207,758 B2* | 6/2012 | Di et al. | 326/120 |
| 8,222,915 B2* | 7/2012 | Manohar et al. | 326/11 |
| 2007/0236983 A1 | 10/2007 | Wang et al. | |
| 2007/0242498 A1 | 10/2007 | Chandrakasan et al. | |
| 2008/0055967 A1 | 3/2008 | Houston et al. | |

OTHER PUBLICATIONS

Foreign Communication From a Related Counterpart Application—International Search Report and Written Opinion, PCT/SG2011/000253, Oct. 17, 2011.

Martin, Alain J., et al., Asynchronous Techniques for System-on-Chip Design, Proceedings of the IEEE, vol. 94, No. 6, Jun. 2006.

"International Technology Roadmap for Semiconductors", Executive Summary ITRS, 2009 Edition, 2009.

Jorgenson, R.D., et al., "Ultralow-Power Operation in Subthreshold Regimes Applying Clockless Logic", Proceedings of the IEEE, vol. 98, No. 2, Feb. 2010.

* cited by examiner

Table I

|  | $Q.T$ (first rail) [301] | $Q.F$ (second rail) [302] |
| --- | --- | --- |
| Valid '0' | 0 | 1 |
| Valid '1' | 1 | 0 |
| 303 —— NULL (Low Standby) | 0 | 0 |
| 304 —— NULL (High Standby) | 1 | 1 |

ASYNCHRONOUS-LOGIC CIRCUIT FOR FULL DYNAMIC VOLTAGE CONTROL

CROSS-REFERENCE TO RELATED APPLICATIONS

This application is a filing under 35 U.S.C. 371 as the National Stage of International Application No. PCT/SG2011/000253, filed Jul. 14, 2011, entitled "ASYNCHRONOUS-LOGIC CIRCUIT FOR FULL DYNAMIC VOLTAGE CONTROL," which claims the benefit of and priority to U.S. Provisional Patent Application No. 61/364,478, filed Jul. 15, 2010 and entitled "ASYNCHRONOUS-LOGIC CIRCUIT FOR FULL DYNAMIC VOLTAGE CONTROL", both of which are incorporated herein by reference in their entirety for all purposes.

FIELD

The present invention relates to a logic circuit, and in particular to asynchronous-logic for full Dynamic Voltage Scaling including operation in the sub-threshold voltage regime for ultra-low power operation.

BACKGROUND

Dynamic Voltage Scaling refers to the scaling of the magnitude of supply voltage to provide a means of power/speed trade-off. Specifically, for higher speed demands, supply voltage is 'dialled-up' and conversely 'dialled-down' when the demand for speed is modest. FIG. 1 depicts the power dissipation (see bold solid line 101) and speed (see bold dotted line 102) characteristics of a digital circuit for a full range of Dynamic Voltage Scaling, where the supply voltage $V_{DD}$ 103 is adjusted from the nominal voltage regime 104 to the near-threshold voltage regime 105 to the sub-threshold voltage regime 106. In FIG. 1, the readings of the power dissipation 101 and the speed 102 of the digital circuit are normalized to those at the nominal voltage 107. At the sub-threshold voltage regime 106, $V_{DD}$ 103 is even below the threshold voltage 108 of transistors, and the digital circuit still works, although significantly slower by merely using a weak-inversion current for charging and discharging, until at the minimum voltage 109 where the transistors therein fail to switch. Interestingly, in some applications, the maximum energy efficiency point/lowest power dissipation point of a digital circuit can be shown at the sub-threshold voltage regime 106 in a book entitled 'Sub-threshold Designs for Ultra Low-power Systems', Springer, 2006, authored by A. Wang, B. H. Calhoun, and A. P. Chandrakasan (herein Wang et al). Thus, operating digital circuits at the sub-threshold voltage regime 106 is highly attractive for ultra-low power dissipation, and when necessary, is suitable for full Dynamic Voltage Scaling for power/speed trade-off.

Sub-threshold operation offers the potential of ultra-low power, including operation at or near the maximum efficiency point or region, albeit very low speed. An important consideration for the practical realization of sub-threshold circuits may be operational robustness, that is their tolerance to process, voltage, and temperature (PVT) variations, whereby the process variations include threshold voltage variations. This difficulty of practical realization may be compounded when smaller geometry nano-scaled fabrication processes are used as these variations become increasingly variable. For example, the process parameter and threshold voltage variations (at nominal $V_{DD}$) detailed in the International Technology Roadmap for Semiconductors (ITRS-2009) stipulate that these variations will increase from 11% and 42% for the current 45 nm process to 32% and 112% for the impending 9 nm process expected in 2024. These variations may strongly influence the circuit performance. As the effects of PVT variations (and permutations thereof) may be severe and largely unpredictable (or intractable), they may lead to unpredictable sub-threshold circuit performance. This appears to be a seemingly insurmountable obstacle to their acceptance within the electronics community and/or to their practical application, save relatively simple applications, for example wrist watches.

Attempts to accommodate the PVT variations in practical realization of complex digital sub-threshold systems include enforcing strict operating environments (e.g. expensive highly controlled fabrication processes and electrical conditions), transistor upsizing (to reduce the effects of random dopent fluctuations), analog-like current-mode approaches, adaptive body biasing, double-gate MOSFET, self-calibration techniques, redundancy circuitry, and adopting 'pessimistic' designs in the sense that large delay safety margins are allowed, etc; the large delay safety margins allowed for would typically include the worst-case delay, including clock skew, setup-time, hold-time for registers, etc. Consequently, designing a system with operation robustness, based on the contemporary and prevalent synchronous-logic design philosophy at the lower range of sub-threshold voltage operation is challenging, largely unsuccessful and/or its operation unnecessarily slower than warranted. This is because in synchronous-logic, a global clock or variants thereof is used for synchronization and every operation must be completed within a clock period. In fact, because a complete profile of the PVT variations is virtually intractable in the sub-threshold voltage regime 106, the circuit operation cannot be guaranteed to be robust (substantially error-free) if the contemporary synchronous-logic design philosophy is adopted. A good description of synchronous-logic design philosophy can be found in a book authored by J. Rabaey, A. Chandrakasan, and B. Nikolic and entitled '*Digital Integrated Circuits, A Design Perspective*', $2^{nd}$ Ed. Upper Saddle River, N.J.: Prentice Hall, 2001. The associated design difficulties of synchronous-logic designs for sub-threshold operation can be found in the book by Wang et al.

An alternative digital logic design philosophy for sub-threshold voltage operation is to adopt the somewhat esoteric asynchronous-logic design philosophy, which is clockless or self-timed. There are four general async approaches: Delay-Insensitive, Self-Timed (including bundled-data), Speed-Independent and Quasi-Delay-Insensitive (QDI). Of these, only the QDI async approach offers the most practical approach for sub-threshold operation, significant advantages of design simplicity (in terms of accommodating PVT variations) and operation robustness. It innately detects the computation delays according to different workloads and operating conditions. A good description of asynchronous-logic design philosophy can be found in a book authored by J. Sparso and S. Fuber and entitled *Principle of Asynchronous Circuit Design: A Systems Perspective*, Norwell M A: Kluwer Academic, 2001 (herein Sparso et al). Further, a good description of the specific QDI approach can be found in a paper authored by A. Martin and M. Nsytrom and entitled '*Asynchronous Techniques for System-on-chip Designs*', IEEE Proceedings, 2006, and in a book authored by S. C. Smith and J. Di and entitled '*Designing Asynchronous Circuits using NULL Convention Logic (NCL)*', Morgan & Claypool, 2009 (herein Smith et al).

QDI circuits are typically implemented in either one of three logic families: Dynamic-Logic, Pass-Logic or Static- Logic. Static-Logic circuits may comprise complementary networks of n- and p-transistors. Typically the n-network ties the output to the ground and the p-network ties the output to the supply voltage. The configuration is such that the two networks are mutually exclusive for operation, and the output is connected at every point in time to either the ground or the supply voltage via a low resistance path. The logic output is thus statically stable and no additional circuitry is therefore needed to hold the output at its intended value. This can be contrasted with Dynamic-Logic, which requires temporary storage of signal values which generally rely on the capacitance of high impedance nodes. As a result of this operation, Dynamic-Logic suffers from current leakage and charge sharing, and thus requires the use of weak keepers to counteract charge leakage/sharing and thus to hold the dynamic signal value.

Known QDI circuits based on the Dynamic-Logic and Pass-Logic families and different variations thereof include differential cascode voltage swing logic (DCVSL), precharged half buffer, and mixed Dynamic-Logic/Pass-Logic/pseudo-Static-Logic. These QDI circuits can be found in literature, and are largely summarized in the abovementioned book authored by Sparso et al, and in a book authored by P. A. Beerel, R. O. Ozdag, and M. Ferretti and entitled 'A Designer's Guide to Asynchronous VLSI', Cambridge University Press, 2010 (herein Beerel et al). For sub-threshold operation, designs based on the Dynamic-Logic family are generally inapplicable or impractical due to their unreliability (poor robustness) and the associated critical sizing of transistors (especially for weak keepers) due to charge leakage/sharing. Similarly, QDI designs based on Pass-Logic family are impractical and not robust for sub-threshold operation due to either a weak logic '1' transfer (for n-MOS pass-logic) or a weak logic '0' transfer (for p-MOS pass-logic), resulting in poor noise margin. In other words, they suffer from weak current strength (especially when transistor stack is high). Furthermore, they often require weak keepers (which in turn require critical transistor sizing) for signal restoring/holding. On the other hand, designs based on the Static-Logic family are more reliable, in part because the associated sizing of transistors is not as critical and their level of noise margin is higher as compared to other logic families.

Reported QDI asynchronous-logic realization approaches based on Static-Logic family include NULL-convention-logic (NCL), Delay-Insensitive-Minterm-Synthesis (DIMS) and Direct Static-Logic Implementation (DSLI). However, these realizations based on these reported QDI realization approaches have relatively high overheads in terms of large IC area, long delays and high power/energy, in part because of their relatively complex realizations. These shortcomings are considerable in large digital systems because of the associated cost (large IC area), slow computation (long delay) and short battery lifespan (high power; or the need to accommodate higher heat).

In summary, the appropriate design methodology to operate digital circuits for full Dynamic Voltage Scaling (including for sub-threshold operation) is to adopt asynchronous-logic design philosophy, specifically the QDI approach with Static-Logic realization approach. At the juncture of technology, there is no operationally robust and yet ultra low power sub-threshold digital circuit, including those digital circuits based on the reported QDI realization approaches. Hence, it is highly desirable to have a design technique that is virtually insensitive to the PVT variations, and the associated attribute is operation robustness and yet ultra low power dissipation for sub-threshold digital circuits. This will be apparent later in this specification.

SUMMARY

As it will be apparent from the following description, one or more embodiments may provide a novel asynchronous-logic realization approach using Static-Logic that allows robust circuit operation in the sub-threshold region. The embodiments yield designs with simultaneous smaller IC area, higher speed and yet lower power than prior-art approaches that offer robust operation in the sub-threshold region. This presents a significant advancement in green technologies as power/energy budgets of such circuits are limited. Embodiments may also be applied to meet the ever increasing demand for portable devices with extended battery lifespan. Other applications include power-critical/energy-critical applications with modest speed requirements, such as physiological and biological sensors, hearing aids, including energy harvesting/scavenging applications, etc.

One implementation of the QDI asynchronous Static-Logic involves the integration of a REQ sub-circuit, a Request input, and two buffers into a Static-Logic cell redesigned for a basic dual-rail QDI circuit. This integration may simultaneously yield smaller IC size, higher speed and lower power dissipation.

According to aspects of the present invention there is provided a logic circuit according to claim 1, 13 or 15, or an asynchronous-logic pipeline according to claim 17, 18 or 19. Embodiments may be implemented according to any one of claim 2 to 12, 14 or 16.

BRIEF DESCRIPTION OF THE FIGURES

One or more embodiments will now be described by way of example only with reference to the accompanying figures in which.

DETAILED DESCRIPTION

In general terms, an embodiment of the present invention provides a new QDI Static-Logic realization approach appropriate for the full range of Dynamic Voltage Scaling. This new approach is termed "Pre-Charged Static-Logic" (PCSL) approach in this specification.

Figure 1:
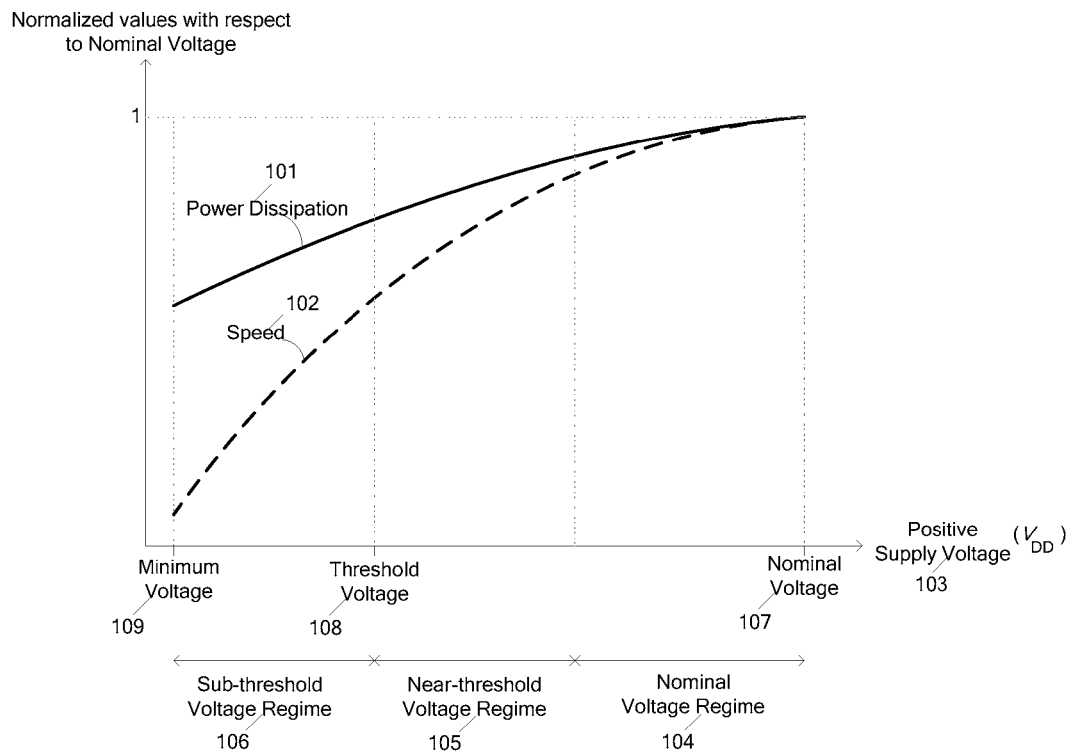
FIG. 1 is a graph showing normalized power dissipation and speed attributes of a digital circuit at various voltages for full Dynamic Voltage Scaling.
Figure 2:
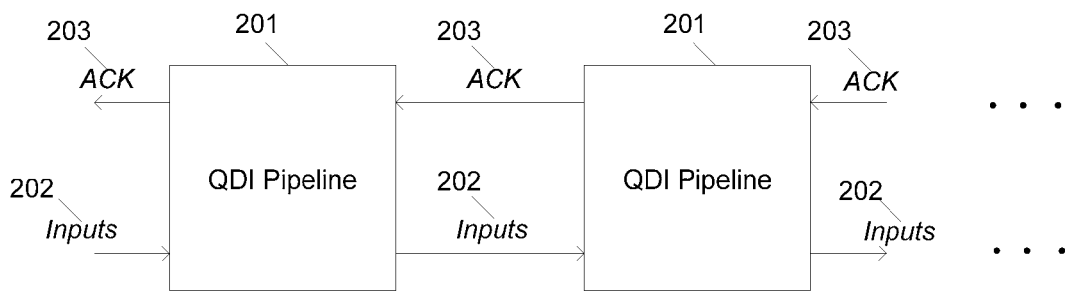
FIG. 2 is a block diagram showing the handshake interfaces of asynchronous-logic QDI pipelines.
Figures 3, 4:
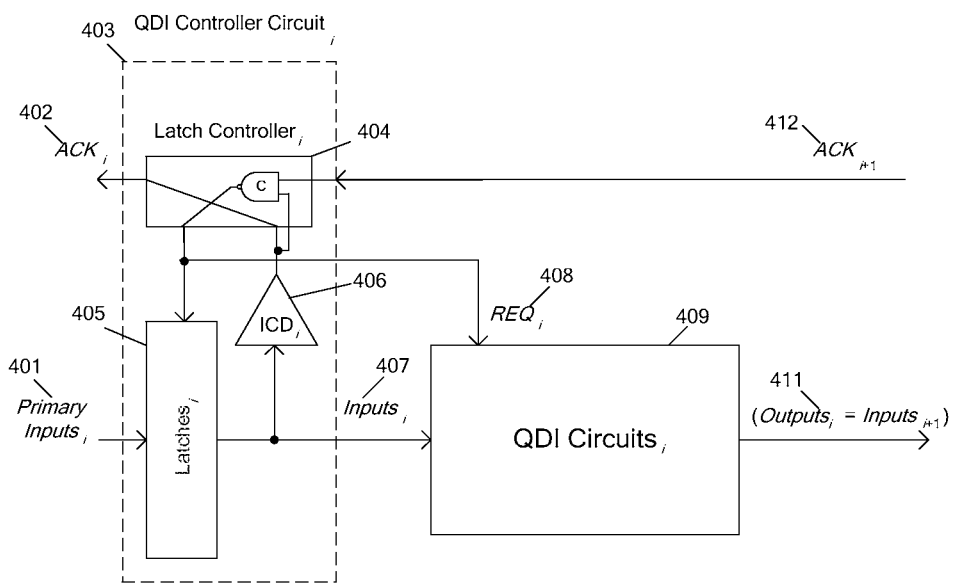
FIG. 3 is the truth table for a dual-rail asynchronous-logic QDI circuit.
FIG. 4 is a block diagram of an example of an asynchronous-logic QDI pipeline stage

FIG. 2 depicts a block diagram of asynchronous-logic QDI pipelines 201. Inputs 202 is the input operands for a plurality of sets of data. Each set of data is encoded in a 1-of-N-rail manner where N is $2^M$, and M is a non-zero integer. For example, FIG. 3 depicts the truth table of a dual-rail (N=2) encoding how a valid and a NULL (standby) data are represented. If the data Q.T 301 and Q.F 302 are of the opposite logic states, the data is considered valid. If the data Q.T 301 and Q.F 302 are of the same logic states, the data is considered NULL. Particularly, a low logic NULL 303 is when the data Q.T 301 and Q.F 302 are both '0''s, and conversely, a high logic NULL 304 is when the data Q.T 301 and Q.F 302 are both Ts.

With reference to FIG. 2, consider now a standard 4-phase operation. During an active operation, one of the rails (in each set of data) will be asserted to indicate a valid data, and the QDI pipelines 201 will decode (i.e. compute) these data and assert the Acknowledge (ACK) signals 203 when the computation is completed. During a NULL i.e. empty (standby) operation, all the rails (in each set of data) will be de-asserted to all '0''s (for low logic NULL) or all (for high logic NULL), and the QDI pipeline 201 will de-assert the ACK signals 203.

The QDI pipelines 201 are self-timed, and detect the computation delays according to different workloads and operating conditions. The QDI pipelines 201 are able to synchronize their operation correctly (at any speed rates), and accommodate any PVT variations for substantially error-free operation.

FIG. 4 depicts a possible pipeline implementation, embodying a QDI Controller Circuit, 403 and QDI Circuits$_i$ 409. Primary Inputs$_i$ 401 is first transferred through Latches$_i$ 405 to be Inputs$_i$ 407. Once Inputs$_i$ 407 are all valid, the Input Completion Detection (ICD$_i$) circuit 406 will assert ACK$_i$ 402, indicating that the data is valid and transferred successfully. Inputs$_i$ 407 will further assert QDI Circuits$_i$ 409 for computation to produce an output, Outputs$_i$ (or equivalent to Inputs$_{i+1}$) 411. Depending on the circuit implementation for QDI Circuits$_i$ 409, REQ$_i$ 408 may be necessary for asserting the QDI Circuits$_i$ 409. Once Inputs$_{i+1}$ 411 is transferred and acknowledged by the successive pipeline stage, ACK$_{i+1}$ 412 will assert the Latch Controller$_i$ 404 to hold Inputs$_i$ 407. Inputs$_i$ 407 will only be reset when Primary Inputs$_i$ 401 become NULL. Thereafter, the ICD$_i$ 406 will de-assert ACK$_i$ 402, informing the preceding pipeline stage that new Primary Inputs$_i$ 401 can now be transferred.

The pipeline structure of FIG. 4 may be modified by rearranging QDI Controller Circuits and QDI Circuits, or by re-grouping them, or by integrating them together. Some of these pipeline modifications can be found in the book by Sparso et al.

The power/speed efficiency and robustness of QDI circuits$_i$ 409 may depend on their circuit realizations. In the subthreshold region regime, Static-Logic circuits are able to offer robust and substantially error-free operation (over other logic families, including Dynamic-Logic and Pass-Logic; see QDI circuits based on these logic families in the books by Sparso et al and Beerel et al).

Figure 5:
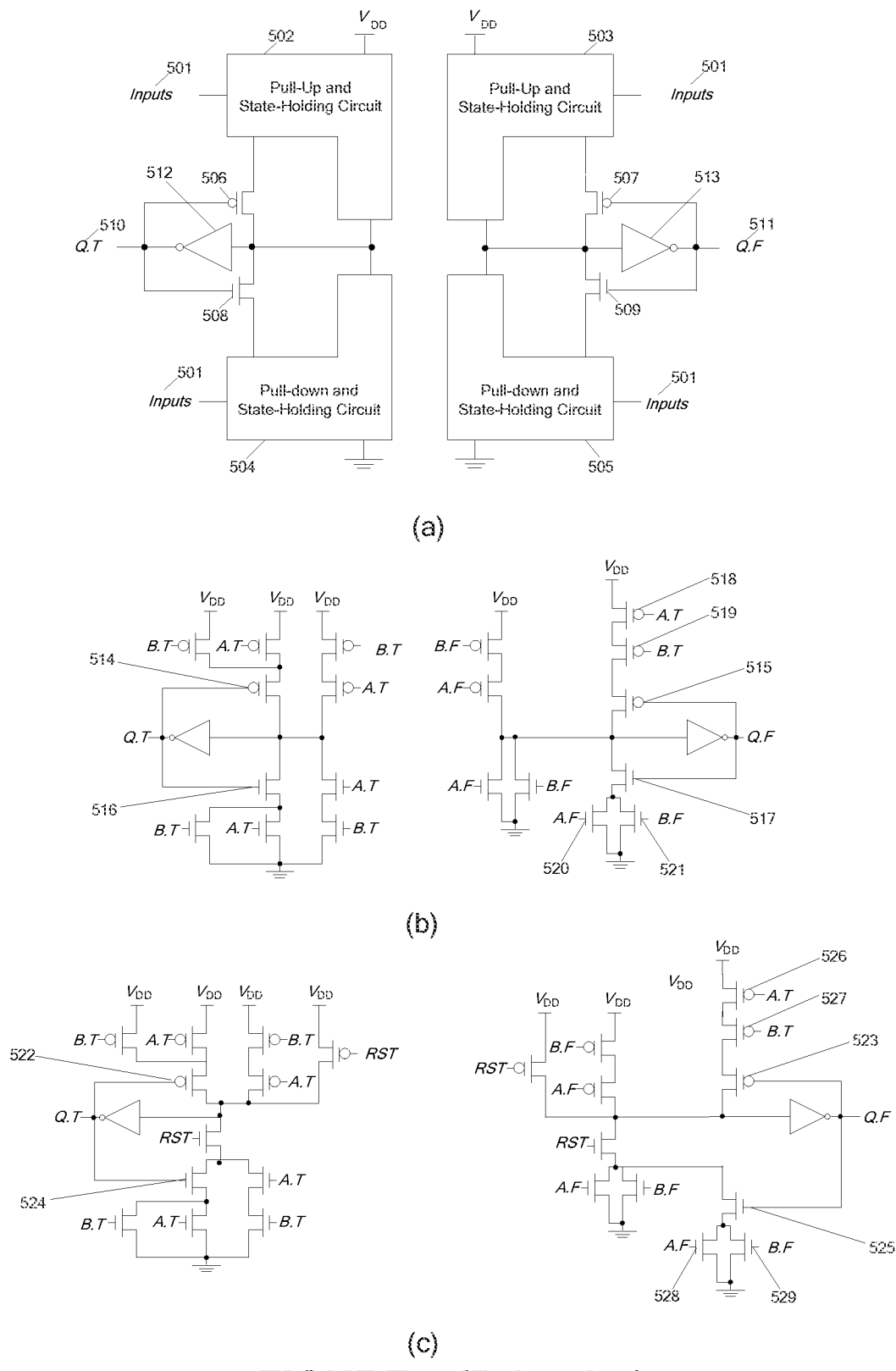
FIG. 5(a) is a prior-art generic circuit diagram of QDI circuit architecture in a threshold-logic realization based on Static-Logic.
FIG. 5(b) is a prior-art AND/NAND QDI circuit schematic based on the threshold-logic NULL Convention Logic (NCL) realization in accordance with the circuit architecture depicted in FIG. 5(a)
FIG. 5(c) is a prior-art AND/NAND QDI circuit schematic based on the threshold-logic NCL realization with an fast reset (RST) in accordance with the circuit architecture depicted in FIG. 5(a)

FIG. 5(a) depicts a generic block diagram of a prior-art Static-Logic dual-rail QDI circuit based on the threshold logic transistor-level realization. The output Q.T 510 is constructed by the Pull-Up and State Holding Circuit 502, Pull-Down and State-Holding Circuit 504, feedback transistors 506, 508, and the buffer 512. The output Q.F 511 is constructed by the Pull-Up and State Holding Circuit 503, Pull-Down and State-Holding Circuit 505, feedback transistors 507, 509, and the buffer 513. Inputs 501 will reset both the outputs Q.T 510 and Q.F 511 (via the Pull-up and State-Holding Circuits 502, 503) to NULL, and when necessary, holds a logic state '0' for the output Q.T 510 and the output Q.F 511 when a valid operation has not been asserted. Conversely, Inputs 501 will also be able to set one of the outputs (either Q.T 510 via the Pull-down and State-Holding Circuits 504 or Q.F 511 via the Pull-down and State-Holding Circuits 505) to '1' for a valid operation, and when necessary, holds a logic state '1' for the outputs Q.T 510 and Q.F 511 when a NULL has not been asserted. Interestingly, the outputs Q.T 510 and Q.F 511 serve not only as the outputs, but also as the inputs connected to the feedback transistors 506, 507, 508, 509 within the QDI circuit. Without a critical sizing of the transistors, although such prior-art designs are appropriate for full Dynamic Voltage Scaling, the drawback is large circuit overhead. Furthermore, the constructions of the Q.T and Q.F output blocks are separate circuit entities, hence area-inefficient. Examples of such designs include threshold-logic NCL circuits and circuits (with and without an additional Reset (RST) signal), and circuits by simply converting dual-rail Dynamic-Logic to dual-rail Static-Logic.

For clarity, FIGS. 5(b) and (c) depict a dual-rail AND/ NAND circuit based on the prior-art threshold-logic NCL circuit with and without an RST signal respectively. The feedback transistors 514, 515, 516, 517 in FIG. 5(b) and the feedback transistors 522, 523, 524, 525 in FIG. 5(c) in part provide the state-holding function. Note that because the Q.F block of the AND/NAND gate (FIGS. 5(b) and (c)) is essentially serves as 'OR' function, hence the transistors 515, 517, 518, 519, 520, 521 in FIG. 5(b) can be removed for optimization, so do the transistors 523, 525, 526, 527, 528, 529 in FIG. 5(c). Nonetheless, even such optimization, the prior-art dual-rail AND/NAND gate is still not area-/speed-/power-efficient.

Figure 6:
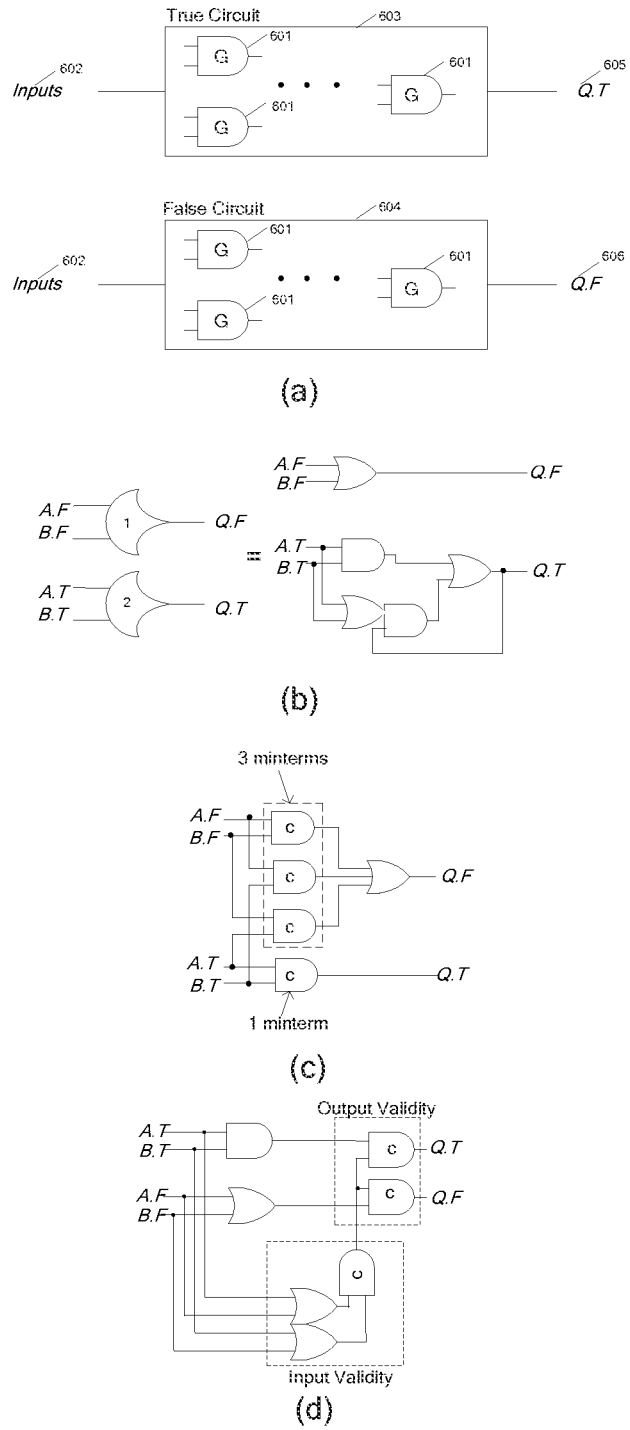
FIG. 6(a) is a prior-art generic circuit diagram of QDI circuit architecture based on a plurality of library cells.
FIG. 6(b) is a prior-art AND/NAND QDI circuit schematic based on the NCL realization in accordance with the circuit architecture depicted in FIG. 6(a)
FIG. 6(c) is a prior-art AND/NAND QDI circuit schematic based on the Delay-Insensitive Minterm Synthesis (DIMS) realization in accordance with the circuit architecture depicted in FIG. 6(a)
FIG. 6(d) is a prior-art AND/NAND QDI circuit schematic based on the Direct Static Logic Implementation (DSLI) realization in accordance with the circuit architecture depicted in FIG. 6(a)

FIG. 6(a) further depicts another generic block diagram of prior-art dual-rail QDI circuits by using standard library cells 601 realized in Static-Logic (including the design structure depicted in FIG. 5(a)). The assertion of True Circuit 603 and False Circuit 604 is mutually exclusive (i.e. either the output Q.T 605 of True Circuit 603 or the output Q.F 606 of False Circuit 604 is asserted), and the de-assertion of True Circuits 603 and False Circuit 604 can be simultaneous. Particularly, Inputs 602 will assert True Circuit 603 for generating an output to '1' if the data is valid (only for True Circuit 603), and de-assert the output to '0' when data is NULL. Similarly, Inputs 602 will assert False Circuit 604 for generating an output to '1' if the data is valid (only for False Circuit 604), and de-assert the output to '0' when data is NULL. Because of a Static-Logic implementation, such prior-art designs are appropriate for full Dynamic Voltage Scaling, but the drawback is area-/speed-/power-inefficient due to a large number of library cells required. Examples of such designs include library-cell based NCL, Delay-Insensitive Minterm Synthesis (DIMS), and Direct Static Logic Implementation (DSLI) circuits. For clarity, FIGS. 6(b) to (d) depict a dual-rail AND/NAND circuit based on the prior-art library cells based on the NCL, DIMS and DSLI approaches respectively where it can be seen that the associated hardware is complex (more complex than the embodiments of the present invention; it will be later shown that these prior-art designs are also simultaneously slower and dissipate higher power than the embodiments of the present invention, see Tables II and III).

Figure 7:
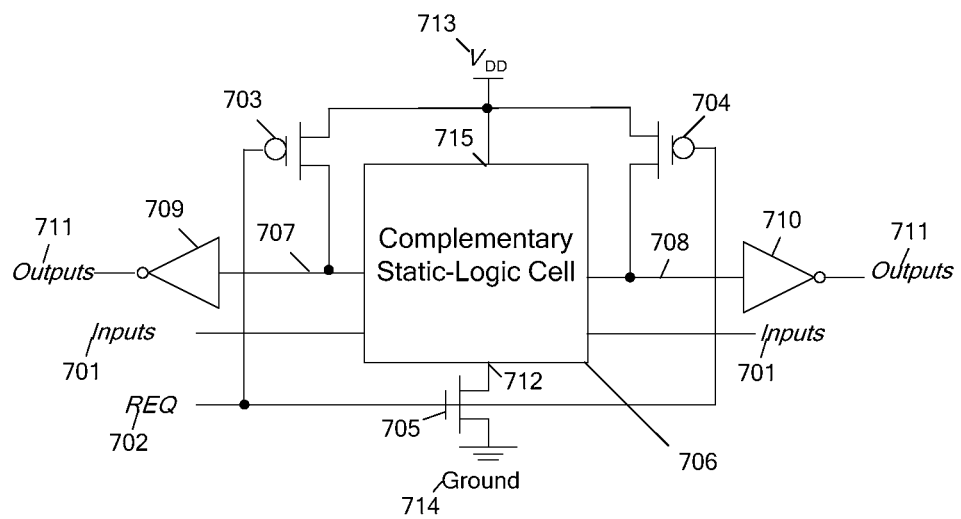
FIG. 7 is a circuit diagram of QDI circuit architecture based on Static-Logic in accordance with an embodiment.

FIG. 7 depicts a block diagram of the architecture of a logic circuit, an embodiment of the present invention, the PCSL approach. As delineated earlier, the objective of the present invention is to realize asynchronous-logic QDI circuits appropriate for full Dynamic Voltage Scaling, including robust sub-threshold voltage operation, and whose realization is simultaneously more hardware efficient (small IC area and/or low circuit overheads), higher speed and yet lower power than all prior-art techniques. The PCSL circuit in FIG. 7 achieves low circuit overheads by means of an integration of a REQ sub-circuit (comprising first, second and third switches respectively in the form of transistors 703, 704, 705, a Request input in the form of the REQ signal 702, and two buffers 709, 710 (one to each circuit outputs 711)) into a Static-Logic cell in the form of a complementary Static-Logic library cell 706 (comprising two data inputs in the form of Inputs 701) redesigned for a basic dual-rail QDI circuit.

This unique integration simultaneously yields the higher speed and yet lower power dissipation. This is as opposed to a design where the Static-Logic cell and a REQ sub-circuit comprising the REQ signal 702 are separate independent circuit entities. To be specific, a possible such prior-art circuit realization could be a DSLI circuit according to FIG. 6(a) where the Static-Logic cell and REQ subcircuit are constructed independently with a plurality of Static-Logic library gates (e.g. AND gates, OR gates, C-Muller gates, etc,), hence they are separate independent circuit entities.

In FIG. 7, the transistors 703, 704 are p-MOS transistors but any other p-type transistor may be used. Similarly, in FIG. 7, the transistor 705 is an n-MOS transistor but any other n-type transistor may be used. The sources of the p-MOS transistors 703, 704 are connected to a high supply rail in the form of the high voltage supply 713. The drains of the p-MOS transistors 703, 704 are connected to first and second Static-Logic cell outputs 707, 708 from the complementary Static-Logic cell 706, and respectively drive the buffers 709, 710 to produce first and second circuit outputs 711 (or dual-rail outputs). The drain of the n-MOS transistor 705 is connected to a low voltage rail in the form of a negative supply rail 712 of the complementary Static-Logic cell 706, and the source of the n-MOS transistor 705 is directly connected to a low supply rail in the form of the low voltage supply 714. The complementary Static-Logic cell 706 further has a high voltage rail in the form of a positive supply rail 715 connected to the high voltage supply 713. The gates of the p-MOS transistors 703, 704 and the gate of the n-MOS transistor 705 are connected to the REQ signal 702.

As shown in FIG. 7, the first and second Static-Logic cell outputs 707, 708 are in communication with the first and second circuit Outputs 711 via the buffers 709, 710 respectively. These buffers 709, 710 have an inverting logic (i.e. are configured for inversion). In particular, the input of each buffer 709, 710 is connected to respective Static-Logic cell outputs 707, 708 of the complementary Static-Logic cell 706 whereas the outputs of the buffers 709, 710 are the circuit outputs—Outputs 711.

The operation of the logic circuit of FIG. 7 comprises an initial phase and an evaluate phase as follows.

During the initial phase, REQ signal 702 is at a negate-valued logic (in this case, '0') to pre-charge the Static-Logic cell outputs 707, 708 from the complementary Static-Logic cell 706 to resulting in a NULL Outputs 711. In particular, when the REQ signal 702 receives the negate-valued logic, the transistors 703, 704 are asserted and the transistor 705 is negated. The negation of the transistor 705 disconnects the complementary Static-Logic cell 706 from the low voltage supply 714, thus the Static-Logic cell 706 is unable to compute (dis-charge) one of the Static-Logic cell outputs 707, 708 even if the Inputs 701 are valid. Furthermore, the assertion of the transistors 703, 704 effectively pre-charges the Static-Logic cell outputs 707, 708. As the pre-charged Static-Logic cell outputs 707, 708 are connected to the circuit outputs 711 via buffers 709, 710 with an inverting logic, the circuit outputs 711 are hence reset to a reset logic value (in this case, '0' or in other words, NULL), rendering the Static-Logic Cell 706 inoperative. The REQ signal 702 also serves as a fast reset signal that significantly shortens the back-forward delay of the circuit, improving the overall speed of the QDI circuit.

During the evaluate phase, when the REQ signal 702 receives an assertive-valued logic (i.e. REQ 702='1'), the transistors 703, 704 are negated whereas the transistor 705 is asserted. This assertion of the transistor 705 connects the complementary Static-Logic cell 706 to the low voltage supply 714, thereby enabling the Static-Logic cell 706 to compute (dis-charge) one of the Static-Logic cell outputs 707, 708 if the Inputs 701 are valid, and the buffers 709, 710 will assert valid outputs 711 (opposite states of the dual-rail signals). When the REQ signal 702 is '1' and Inputs 701 is yet valid (i.e. pending for an active operation), the complementary Static-Logic cell 706 will hold its outputs 711.

In the logic circuit of FIG. 7, the Static-Logic cell outputs 707, 708 are either charged through the high voltage supply 713 or discharged through the negative supply rail 712 to the low voltage supply 714. These charging and discharging operations are performed in a mutually exclusive manner.

Figure 8:
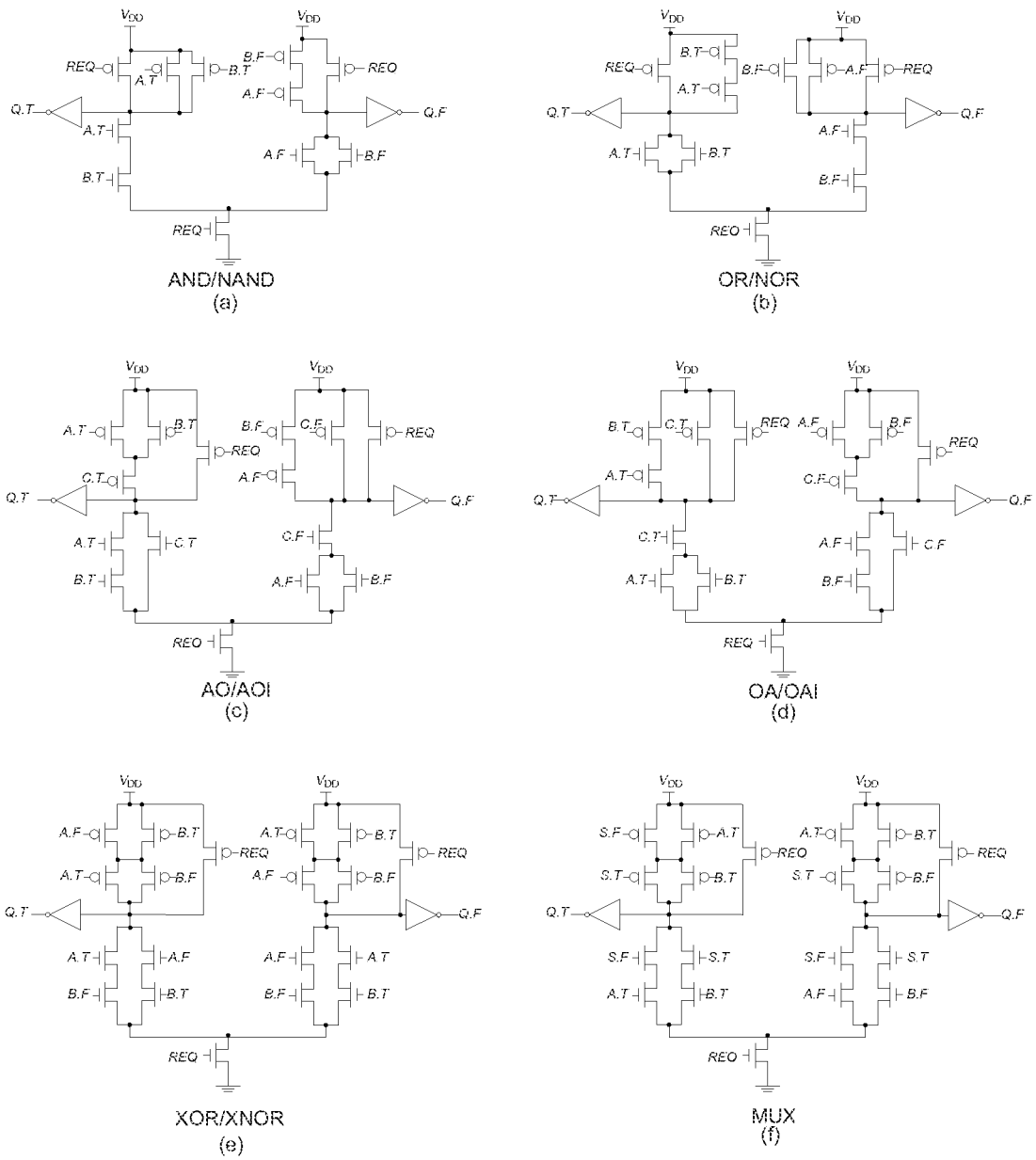
FIG. 8(a) is a circuit schematic of a 2-input AND/NAND QDI circuit in accordance with the embodiment depicted in FIG. 7.
FIG. 8(b) is a circuit schematic of a 2-input OR/NOR QDI circuit in accordance with the embodiment depicted in FIG. 7.
FIG. 8(c) is a circuit schematic of a 3-input AND_OR/ AND_OR_INV (AO/AOI) QDI circuit in accordance with the embodiment depicted in FIG. 7.
FIG. 8(d) is a circuit schematic of a 3-input OR_AND/ OR_AND_INV (OA/OAI) QDI circuit in accordance with the embodiment depicted in FIG. 7.
FIG. 8(e) is a circuit schematic of a 2-input XOR/XNOR QDI circuit in accordance with the embodiment depicted in FIG. 7.
FIG. 8(f) is a circuit schematic of a 2-input MUX QDI circuit in accordance with the embodiment depicted in FIG. 7.

To delineate the design of basic digital cells embodying the PCSL architecture that simultaneously features lower hardware overheads, higher speed and yet lower power dissipation than prior-art designs, FIGS. 8(*a*) to (*f*) depict a 2-input AND/NAND gate, a 2-input OR/NOR gate, a 3-input AND_OR/AND_OR_INV (AO/AOI) gate, a 3-input OR_AND/OR_AND_INV (OA/OAI) gate, a 2-input XOR/XNOR gate, and a 2-input MUX gate respectively based on the present invention. A person skilled in the art can simply design other QDI cells based on the present invention. The design of basic digital cells embodying the prior-art approaches (e.g. NCL, DSIM and DSLI) can be found in FIGS. 5 and 6, and the books authored by Sparso et al and Smith et al. On a basis of 7 cells, a 2-input AND/NAND gate, a 2-input OR/NOR gate, a 3-input AO/AOI gate, a 3-input OA/OAI, a 2-input XOR, a 2-input MUX and a 3-input full adder, using a 130 nm CMOS process at sub-threshold voltage 0.15V, the designs based on the present invention are on average simultaneously 3× smaller IC area, 2.5× faster speed, and 2.3× lower energy/operation over the prior-art Static-Logic QDI designs—note that these worthy advantages are obtained simultaneously.

Figure 9:
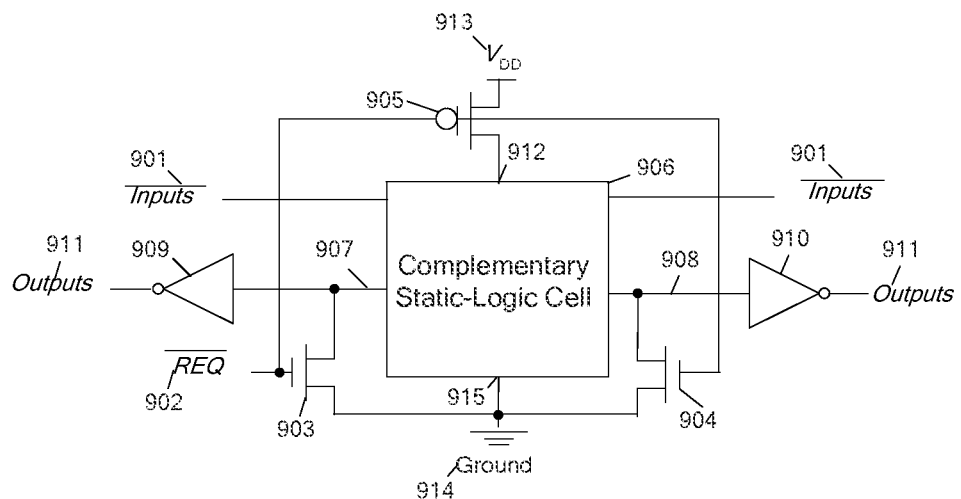
FIG. 9 is a circuit diagram of another QDI circuit architecture based on Static-Logic in accordance with an embodiment.

It is also possible to use inverted input operands. FIG. 9 depicts a block diagram of an alternative structure, a complementary design, employing the PCSL approach. This alternative structure also achieves low circuit overheads by means of an integration of a REQ sub-circuit (comprising first, second and third switches respectively in the form of transistors 903, 904, and 905, a Request input in the form of the $\overline{REQ}$ signal 902, and two buffers 909, 910 (to circuit Outputs 911)) into a Static-Logic cell in the form of a complementary Static-Logic library cell 906 (comprising two data inputs in the form of $\overline{Inputs}$ 901) redesigned for a basic dual-rail QDI circuit. Particularly, in FIG. 9, the transistors 903, 904 are n-MOS transistors but any other n-type transistor may be used. Similarly, in FIG. 9, the transistor 905 is a p-MOS transistor but any other p-type transistor may be used. The sources of the n-MOS transistors 903, 904 are connected to a low supply rail in the form of the low voltage supply 914. The drains of the n-MOS transistors 903, 904 are connected to first and second Static-Logic cell outputs 907, 908 from the complementary Static-Logic cell 906, and respectively drive the buffers 909, 910 to produce first and second circuit outputs (or dual-rail outputs) 911. The drain of the p-MOS transistor 905 is connected to a high voltage rail in the form of a positive supply rail 912 of the complementary Static-Logic cell 906, and the source of the p-MOS transistor 905 is directly connected to a high supply rail in the form of the high voltage supply 913. The complementary Static-Logic cell 906 further has a low voltage rail in the form of a negative supply rail 915 connected to the low voltage supply 914. The gates of the n-MOS transistors 903, 904 and the gate of the p-MOS transistor 905 are connected to the $\overline{REQ}$ signal 902.

Similar to the logic circuit shown in FIG. 7, the first and second Static-Logic cell outputs 907, 908 of the logic circuit of FIG. 9 are in communication with the first and second circuit outputs 911 via the buffers 909, 910 having an inverting logic (i.e. configured for inversion). In particular, the input of each buffer 909, 910 is connected to respective Static-Logic cell outputs 907, 908 of the complementary Static-Logic cell 906 whereas the outputs of the buffers 909, 910 are the circuit outputs—Outputs 911.

The logic circuit operation of the alternative structure of FIG. 9 also comprises an initial phase and an evaluate phase as follows.

During the initial phase, the $\overline{REQ}$ signal 902 is at a negate-valued logic (in this case '1') to dis-charge the Static-Logic cell outputs 907, 908 from the complementary Static-Logic cell 906 to '0''s, resulting in a NULL output (both '1''s for Outputs 911). In particular, when the $\overline{REQ}$ signal 902 receives the negate-valued logic, the transistors 903, 904 are asserted and the transistor 905 is negated. The negation of the transistor 905 disconnects the Static-Logic cell 906 from the high voltage supply 913, thus the Static-Logic cell 906 is unable to compute (charge) one of the Static-Logic cell outputs 907, 908 even if $\overline{Inputs}$ 901 are valid. Furthermore, the assertion of the transistors 903, 904 effectively dis-charges the Static-Logic cell outputs 907, 908. As the dis-charged Static-Logic cell outputs 907, 908 are connected to the circuit outputs 911 via buffers 909, 910 with an inverting logic, the circuit outputs 911 are hence reset to a reset logic value (in this case, '1'), rendering the Static-Logic Cell 906 inoperative. The $\overline{REQ}$ signal 902 also serves as a fast reset signal that significantly shortens the back-forward delay of the circuit, improving the overall speed of the QDI circuit.

During the evaluate phase, when the $\overline{REQ}$ signal 902 receives an assertive-valued logic (i.e. $\overline{REQ}$ signal 902='0'), the transistors 903, 904 are negated whereas the transistor 905 is asserted. This assertion of the transistor 905 connects the complementary Static-Logic cell 906 to the high voltage supply 913, thereby enabling the Static-Logic cell 906 to compute (charge) one of the Static-Logic cell outputs 907, 908 if $\overline{Inputs}$ 901 are valid, and the buffers 909, 910 will assert valid outputs 911 (opposite states of the dual-rail signals). When REQ $\overline{902}$ is '0' and $\overline{Inputs}$ 901 is yet valid (i.e. pending for an active operation), the complementary Static-Logic cell 906 will hold its Outputs 911.

Figure 10:
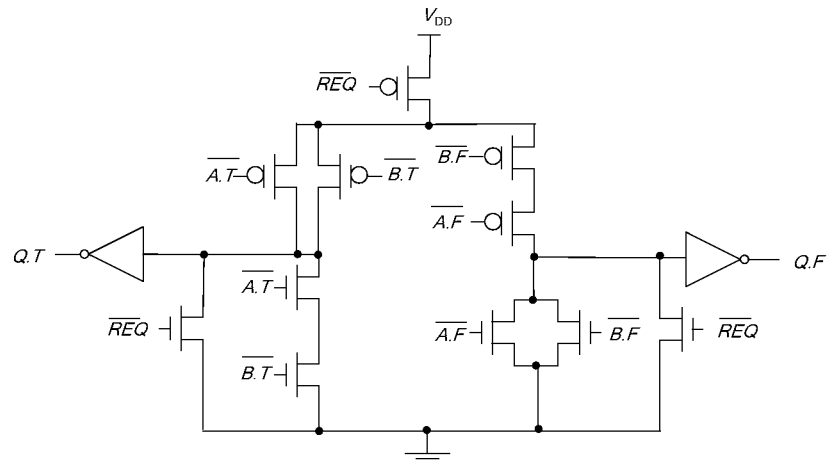
FIG. 10 is a circuit schematic of another 2-input AND/ NAND QDI circuit in accordance with the embodiment depicted in FIG. 9.

FIG. 10 depicts a 2-input AND/NAND gate based on the alternative structure of FIG. 9. Other QDI cells can be designed based on this alternative structure, and these QDI cells embodying the present invention feature the same advantages as the structure depicted in FIG. 7—simultaneous hardware simplicity, faster and lower power dissipation over other prior-art QDI cells.

The REQ sub-circuit (e.g. transistors 703, 704, and 705 associated with REQ 702 in FIG. 7 or transistors 903, 904, 905 associated with $\overline{REQ}$ 902 in FIG. 9) can be redesigned in a number of ways wherein the REQ sub-circuit is still an integral part of either the complementary Static-Logic cell 706 or the complementary Static-Logic cell 906. For instance, more transistors can be connected either in series or parallel to serve the same function of the REQ sub-circuit. Furthermore, other signals (in addition to REQ 702 or $\overline{REQ}$ 902) can be inserted into the REQ sub-circuit to improve controllability, either to reset or to evaluate the QDI circuit. There may also be more than one Request input and more than one transistor may be controlled by either the same Request input or different Request inputs.

The buffers 709, 710, 909, 910 can be redesigned in a number of ways wherein the buffers 709, 710, 909, 910 are to initialize a proper NULL operation (either all '0''s or all '1''s) appropriate for a pre-defined handshake signaling, or to provide higher load drivability, or both. For instance, an inverter chain can be used for each buffer 709, 710, 909, 910. Furthermore, the buffers 709, 710, 909, 910 can also be eliminated where the NULL operation received by input operands and by output operands is at different logic states. The buffers also need not have an inverting-logic. Instead, they may have a non-inverting logic (i.e. they may be configured for non-inversion).

A dual-rail circuit can be modified to any 1-of-N-rail circuits by using these design principles. For example, for a 1-of-4-rail circuit, the complementary Static-Logic cells 706, 906 can be redesigned into a quad Static-Logic cell for 4 outputs, and wherein only one of the 4 outputs can be asserted during an active operation.

The present invention thus far has been described for the design of basic digital cells. This invention can be applied to virtually all aspects of a digital QDI system, including systems that employ basic digital cells. For example, consider the design of a QDI pipeline.

Figure 11:
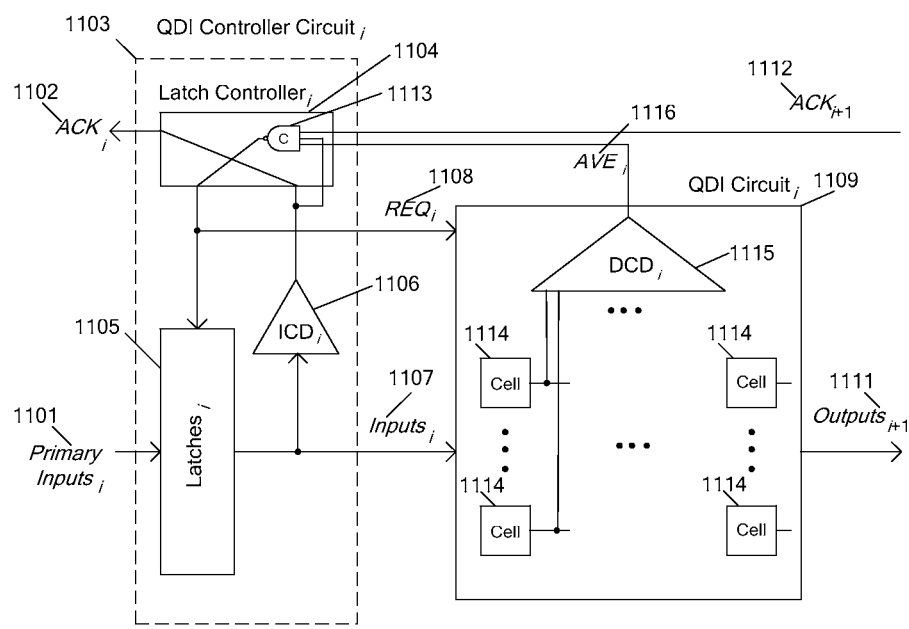
FIG. 11 is a block diagram of a QDI pipeline stage i where the cell is an embodiment of the invention in accordance with the fully-QDI protocol.

The pipeline operation embodying the circuits using the design principle mentioned in the present invention is similar to that in FIG. 4, and its specific pipeline implementation can be modified according to the specific control signals. For example, FIG. 11 shows a pipeline structure where the library cells 1114 designed based on the present invention are embodied in QDI Circuit, 1109. The Data Completion Detection ($DCD_i$) 1115, comprising OR gates and C-Muller gates, generates an All Valid/Empty ($AVE_i$) signal 1116 which is used to detect the validity/nullity signals generated in part from the library cells 1114. $AVE_i$ 1116 will thereafter feedback the C-Muller gate 1113 which in turn control Latches$_j$ 1105 for either passing Primary Inputs$_i$ 1101 to Inputs$_i$ 1107 or holding Inputs$_i$ 1107. The pipeline structure in FIG. 11 fully abides by the QDI protocol (termed 'Fully-QDI'), hence its pipeline operation is extremely robust (in terms of accommodating PVT variations).

To delineate the advantages of the present invention, on the basis of the established ISCAS C880, C6288, S344, and S1238 benchmarks, Table II respectively show the area (proportional to the hardware overheads), delay, and energy/operation figures-of-merit of the ISCAS benchmarks redesigned as the Fully-QDI pipelines employing the PCSL and the prior-art NCL, DISM and DSLI approaches. For ease of interpreting the results, the figures-of-merit are normalized with respect to the results obtained for the pipeline employing the invented PCSL approach. From Table II, it can be seen that the Fully-QDI pipelines employing the invented PCSL approach simultaneously achieve the smallest area, least delay, and the lowest energy/operation. These simultaneous advantages are considerable and highly valued in practical IC designs.

TABLE II

Benchmarking of Area, Delay and Energy/Operation of Fully-QDI Pipelines based on the Present Invention and the Prior-Art Designs

|  | Area | Delay | Energy/Operation |
| --- | --- | --- | --- |
| Present Invention | 1.0× | 1.0× | 1.0× |
| Prior-Art | 1.9× | 2.1× | 2.5× |

Figure 12:
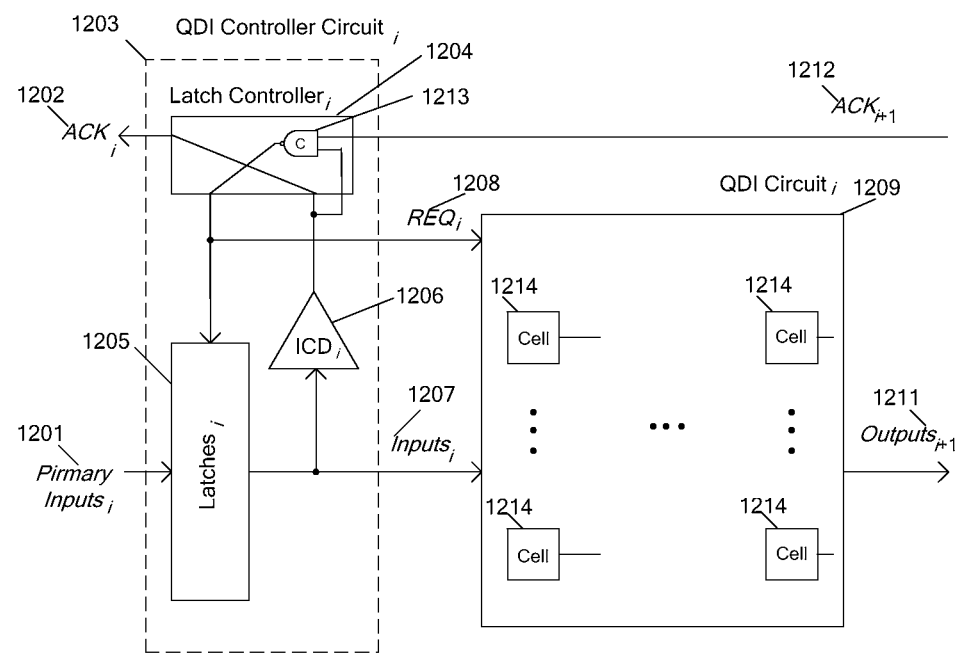
FIG. 12 is a block diagram of a QDI pipeline stage i where the cell is an embodiment of the invention in accordance with the pseudo-QDI protocol.

FIG. 12 depicts an alternative pipeline structure where library cells 1214 designed based on the present invention are similarly embodied in QDI Circuit$_i$ 1209. Note that this pipeline structure does not include $DCD_i$ (see FIG. 11) to fully acknowledge the output signals in part generated by the library cells 1214. As a result, the pipeline structure in FIG. 12 does not fully abide by the QDI protocol (termed 'Pseudo-QDI') because it requires an implicit timing during the reset phase to guarantee error-free operation. Nonetheless, such implicit timing is easily satisfied in practice; this implicit timing has been verified to yield designs with robust operation by means of well-established ISCAS benchmark circuits with very large variations, specifically for ±3σ process variations in 130 nm CMOS.

On the basis of the same ISCAS benchmarks, Table III respectively shows the area, delay and energy/operation figures-of-merit of the ISCAS benchmarks redesigned as the Pseudo-QDI pipelines employing the PCSL and the prior-art NCL, with a fast RST signal (see FIG. 5(c)). As before, for ease of interpretation, the figures-of-merit are normalized with respect to the results obtained for the pipeline employing the inventor PCSL approach. From Table III, it can be seen that the Pseudo-QDI pipelines employing the invented PCSL approach simultaneously achieve smaller area, faster delay and lower energy/operation.

TABLE III

Benchmarking of Area, Delay and Energy/Operation of Pseudo-QDI Pipelines based on the Present Invention and the Prior-Art Designs

|  | Area | Delay | Energy/Operation |
| --- | --- | --- | --- |
| Present Invention | 1.0× | 1.0× | 1.0× |
| Prior-Art | 2.1× | 1.5× | 1.6× |

Of the two Fully-QDI and Pseudo-QDI pipelines, the latter pipeline is, as expected, more IC area-efficient and energy-efficient than the former (due to a simpler pipeline structure in the latter). In terms of speed, both pipelines are comparable. In both pipeline designs, pipelines embodying the present invention feature the simultaneously least IC-area, fastest speed and lowest power dissipation compared to the same pipelines embodying prior-art QDI designs.

Figure 13:
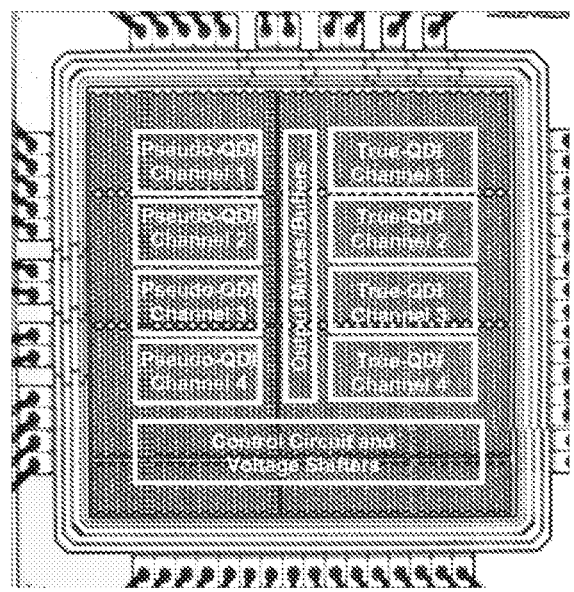
FIG. 13 is the microphotograph of the fabricated prototype Fully-QDI and Pseudo-QDI FIR filters.

To delineate the robustness of the Fully-QDI and Pseudo-QDI pipelines depicted in FIGS. 11 and 12 respectively, consider the design of an 8-tap 8-bit Finite Impulse Response (FIR) filter based on each of these pipeline structures. Both the Fully-QDI and pseudo-QDI FIR filters were designed and fabricated in a 130 nm CMOS process and based on the library cells designed based on the present invention. As expected, both Fully-QDI and Pseudo-QDI FIR filters were functional for full-range dynamic voltage scaling, ranging from the nominal voltage of 1.2V down to the lower range of sub-threshold voltage region of 130 mV (where the transistors therein fail to operate). The microphotograph of the fabricated prototype Fully-QDI and Pseudo-QDI FIR filters is shown in FIG. 13. Also as expected, both Fully-QDI FIR and Pseudo-QDI FIR filters were found to be operationally robust, even with large operating supply voltage variations and with large temperature changes from 25° C. to −55° C. Further as expected, both the Fully-QDI and Pseudo-QDI FIR filters were energy-efficient, and at the sub-threshold voltage range of 0.25V to 0.3V, they featured the most energy-efficiency voltage point. Of the two designs, the Pseudo-QDI FIR filter was, as expected, found to be more energy-efficient and IC area-efficient than the Fully-QDI filter (due to a simpler pipeline structure in the former). In terms of speed, both designs are comparable.

In summary, the invented PCSL technique offers a unique approach that offers simultaneous lower hardware overheads (IC area), faster operation (less delay) and yet lower power dissipation than prior-art approaches appropriate for full Dynamic Voltage Scaling including sub-threshold operation.

It should be clear that a skilled person in the art can further modify the pipeline structure in a number ways by modifying either (or both) QDI Circuit$_i$ 409, 1109, 1209 or QDI Controller Circuit$_i$ 403, 1103, 1203 wherein the library cells based on the present invention are part thereof. Such modifications may include moving QDI Controller Circuit$_i$ 403, 1103, 1203 after QDI Circuit$_i$ 409, 1109, 1209, adding/deleting any intermediate signals suitable for various specific communication channels, adding/removing completion detection circuits for acknowledging the signal validity/nullity, and combining/splitting different pipelines.

It should be also clear that a skilled person in the art can re-arrange in a number of ways the library cells based on the present invention in a pipeline structure. Such re-arrangement includes placing the library cells based on the present invention at different columns and at different rows in QDI Circuit, 409, 1109, 1209 and interleaving the library cells based on the present invention with other prior-art library cells.

It should be even clear that a skilled person in the art can incorporate in a number of ways the library cells based on the present invention into the various blocks in a pipeline structure. Such in-corporation may include applying the library cells based on the present invention to QDI Controller Circuit$_i$ 403, 1103, 1203 (including Latches$_i$ 405, 1105, 1205, Latch Controller$_i$ 404, 1104, 1204 and ICD$_i$ 406, 1106, 1206) and QDI Circuit$_i$ 409, 1109, 1209, and grouping the library cells based on the present invention with other prior-art library cells.

The foregoing describes preferred embodiments, which, as will be understood by those skilled in the art, may be subject to variations or modifications in design, construction or operation without departing from the scope of the claims. For example, the logic level '1' may be interchangeably referred to as 'logic high' and logic level '0' may also be interchangeably referred to as 'logic low'. These variations, for instance, are intended to be covered by the scope of the claims.

The invention claimed is:

1. A logic circuit for connection between a first voltage supply and a second voltage supply comprising:
   a Static-Logic cell for connection between a first voltage rail and a second voltage rail,
   two Static-Logic cell outputs, wherein the two Static-Logic cell outputs are mutually exclusively charged either to the first voltage supply or to the second voltage supply, and
   two transistors,
   wherein the logic circuit is configured for an initial phase and an evaluate phase,
   and wherein during the initial phase, the two transistors are asserted and connect each of the two Static-Logic cell outputs respectively to the first voltage supply,
   and wherein during the evaluate phase, the two transistors are negated and the first voltage rail is connected to the first voltage supply, and the second voltage rail is connected to the second voltage supply.

2. The logic circuit in claim 1 further comprising two Static-Logic cell inputs, and depending on data in the two Static-Logic cell inputs, the voltage of the two Static-Logic cell outputs is either:
   substantially the voltage of the first voltage rail, or
   substantially the voltage of the second voltage rail.

3. The logic circuit in claim 1 further comprising a further switch, and during the evaluate phase the further switch connects the second voltage rail to the second voltage supply.

4. The logic circuit in claim 1 further comprising two Static-Logic cell inputs, a Request input, and depending on data in the two Static-Logic cell inputs and on the datum in the Request input, both the two Static-Logic cell outputs are connected to the first voltage supply or to the second voltage supply.

5. The logic circuit in claim 1 further comprising:
   a first buffer or inverter-buffer,
   a second buffer or inverter-buffer, and
      the first buffer or inverter-buffer and the second buffer or inverter-buffer having respective inputs and outputs,
      the input of the first buffer or inverter-buffer is configured to connect to one of the two Static-Logic cell outputs,
      the input of the second buffer or inverter-buffer is configured to connect to the other of the two Static-Logic cell outputs, and
      the output of the first buffer or inverter-buffer and the output of the second buffer or inverter-buffer are two outputs of the logic circuit.

6. The logic circuit in claim 5 further comprising:
   a Request input,
   two Static-Logic cell inputs, and
   a further transistor,
   wherein during the initial phase and when the Request input receives a negate-valued datum, the further transistor disconnects the second voltage rail from the second voltage supply,
   and wherein during the evaluate phase and when the Request input receives an assertive-valued datum, the further transistor connects the second voltage rail to the second voltage supply.

7. The logic circuit in claim 6 wherein during the initial phase, the logic circuit produces Null data where the two logic circuit outputs have the same logic value, and during the evaluate phase, the logic circuit produces Valid data where data of one of the two outputs of the logic circuit is of opposing logic value to other of the two outputs of the logic circuit.

8. The logic circuit in claim 7 wherein during the evaluate phase and depending on data in the two Static-Logic cell inputs, the voltage of the two Static-Logic cell outputs is either:
   substantially the voltage of the first voltage rail, or
   substantially the voltage of the second voltage rail.

9. The logic circuit in claim 8 wherein the two transistors are p-MOS transistors, and the further transistor is an n-MOS transistor.

10. The logic circuit in claim 9 where the voltage of the first voltage supply is higher than the voltage of the second voltage supply.

11. The logic circuit in claim 8 wherein the two transistors are n-MOS transistors, and the further transistor is a p-MOS transistor.

12. The logic circuit in claim 11 wherein the voltage of the second voltage supply is higher than the voltage of the first voltage supply.

13. A logic circuit configured to connect between a high voltage supply and a low voltage supply comprising:
   two outputs,
   a complementary Static-Logic cell having at least two inputs and at least two outputs, a high voltage rail for connection to the high voltage supply, and having a low voltage rail, wherein the at least two outputs are mutually exclusively charged either to the high voltage supply or to the low voltage supply,
   two p-type transistors,
   an n-type transistor,
   two buffers, and
   a Request input,
   wherein the source and drain of one of the two p-type transistors are respectively connected to the high voltage supply and to one of the two complementary Static-Logic cell outputs,
   and wherein the source and drain of the other of the two p-type transistors are respectively connected to the high voltage supply and to the other of the two complementary Static-Logic cell outputs,
   and wherein the source and drain of the n-type transistor are respectively connected to the low voltage supply and to the low voltage rail,
   and wherein the gates of the two p-type transistors and the gate of the n-type transistor are connected to the Request input, the input of one of the two buffers is connected to the one of the two complementary Static-Logic cell outputs, the input of the other of the two buffers is connected to the other of the two complementary Static-Logic cell outputs, and the outputs of the two buffers are the two outputs.

14. The logic circuit in claim 13 where the two buffers have either inverting logic or non-inverting logic.

15. A logic circuit connected between a high voltage supply and a low voltage supply, and comprising:

two outputs, a complementary Static-Logic cell having at least two inputs and at least two outputs, a low voltage rail connected to the low voltage supply, and a high voltage rail, wherein the at least two outputs are mutually exclusively charged either to the high voltage supply or to the low voltage supply, a p-type transistor, two n-type transistors, two buffers, and a Request input, the source and drain of one of the two n-type transistors are respectively connected to the low voltage supply and to one of the two complementary Static-Logic cell outputs, the source and drain of the other of the two n-type transistors are respectively connected to the low voltage supply and to the other of the two complementary Static-Logic cell outputs, the source and drain of the p-type transistor are respectively connected to the high voltage supply and to the high voltage rail, the gates of the p-type transistor and the gates of the two n-type transistors are connected to the Request input, the input of a first of the two buffers is connected to the one of the two complementary Static-Logic cell outputs, the input of a second of the two buffers is connected to the other of the two complementary Static-Logic cell outputs, and the outputs of the two buffers are the two outputs.

16. The logic circuit in claim 15 where the two buffers have either inverting logic or non-inverting logic.

17. The logic circuit of claim 1, wherein the logic circuit forms a portion of an asynchronous-logic pipeline.

18. The logic circuit of claim 13, wherein the logic circuit forms a portion of an asynchronous-logic pipeline.

19. The logic circuit of claim 15, wherein the logic circuit forms a portion of an asynchronous-logic pipeline.

\* \* \* \* \*